United States Patent [19]

Ravas, Jr. et al.

[11] Patent Number: 5,461,358
[45] Date of Patent: Oct. 24, 1995

[54] RESISTANCE MEASUREMENT CIRCUIT FOR EXTERNAL DEPLOYMENT PATH OF SIR SYSTEM

[75] Inventors: Richard J. Ravas, Jr.; Kevin D. Kincaid, both of Kokomo, Ind.

[73] Assignee: Delco Electronics Corporation, Kokomo, Ind.

[21] Appl. No.: 118,834

[22] Filed: Sep. 8, 1993

[51] Int. Cl.$^6$ .............................. B60R 21/08; B60Q 1/00
[52] U.S. Cl. ........................ 340/438; 324/550; 324/715; 324/718; 307/10.1; 280/735
[58] Field of Search ...................... 324/550, 715, 324/718; 340/438; 307/10.1; 280/735

[56] References Cited

U.S. PATENT DOCUMENTS 3,714,627  1/1973  Dillman et al. ......................... 280/735
4,243,971  1/1981  Suchowerskyj et al. ............... 340/438
4,574,233  3/1986  Taylor ..................................... 323/316
4,893,109  1/1990  Vrabel et al. ........................... 340/438

*Primary Examiner*—Joseph Mancuso
*Assistant Examiner*—Andrew B. Christensen
*Attorney, Agent, or Firm*—Mark A. Navarre

[57] ABSTRACT

An inflatable restraint system includes a diagnostic circuit which measures the resistance of an external deployment path containing a squib. The circuit supplies a test current through the path and measures the voltage across the path which is monitored by a microprocessor. A vehicle battery supplies the power to the system and is connected to a constant current source in series with the external path to provide the test current. A current limiting device between the external circuit and ground comprises a current sink allowing a maximum safe current in the external circuit in the event of inadvertent application of battery voltage to the external circuit and, during a normal resistance test, imposes only a small voltage drop on the test current circuit.

3 Claims, 1 Drawing Sheet

RESISTANCE MEASUREMENT CIRCUIT FOR EXTERNAL DEPLOYMENT PATH OF SIR SYSTEM

FIELD OF THE INVENTION

This invention relates to supplemental inflatable restraint systems, and more particularly, to a diagnostic circuit for monitoring the external deployment path by a resistance measurement.

BACKGROUND OF THE INVENTION

Supplemental inflatable restraints (SIR) or air bags are used in automotive vehicles to deploy upon detecting an impact to cushion the driver or other occupant from injury as a result of the impact. Such systems include a sensing and deployment module, a squib controlled by the module to fire when an impact is sensed, an inflatable bag, and an inflating device triggered by the squib to deploy the bag. The squib is outside the module in an external deployment path. The module includes a diagnostic capability for checking or monitoring the resistance of the external path, thereby verifying that the squib is operable.

A conventional diagnostic circuit for measuring the resistance in the external path of a SIR is shown in FIG. 1. The external path 12 containing the squib 14 is coupled by connectors 16 to the sensing and deployment module 18 which includes the diagnostic circuit 20. The diagnostic circuit is supplied by the vehicle battery 22 and the voltage is increased and regulated by a boost supply 24.

A constant current source 26 is connected from the boost supply 24 to one end of the external path 12 via a connector 16, while the other connector 16 connects the path 12 through a current limiting device comprising resistor 28 and a transistor switch 30 to ground. The inputs of a differential amplifier 32 are connected to either end of the external path 12 adjacent the connectors 16, and the amplifier output is fed through an A/D converter 34 and the resulting digital data is fed to a microprocessor 36. The switch 30 is controlled directly or indirectly by the microprocessor 36 via line 38.

The circuit operates when the transistor switch 30 is turned on, allowing the current output of the constant current source 26 to pass through the external path 12 to ground. The voltage developed across the external path, which is indicative of the integrity or fitness of the path, is amplified and sampled by the microprocessor for analysis. The current of the current source 26 is chosen to be small enough, say 150 mA, to impose no danger of either firing the squib or heating it enough to cause chemical deterioration.

When the switch 30 is turned on for a test, the fixed current flows through the external path 12 and the voltage generated across the path is amplified, digitized and then assessed by the microprocessor which is programmed to determine the condition of the external path. The resistor 28 is of the order of 100 ohms and is necessary to limit current to a harmless value in the event that battery voltage is inadvertently applied to the high end of the external path 12 while the transistor switch 30 is conducting.

The test current of 150 mA will cause a voltage drop of 15 volts in the resistor 28 and additional voltage drops in current source 26, the squib 14 and the transistor 30 for a total voltage drop of at least 18 volts. The vehicle battery voltage, having a range of 9 to 16 volts is insufficient to directly supply 18 volts so that the boost supply 24, affording 18 to 36 volts, is necessary.

It is desirable to avoid the expense of the boost supply and thus an alternate resistance measurement circuit is here proposed.

SUMMARY OF THE INVENTION

It is therefore an object of the invention to test the external deployment path of a supplemental inflatable restraint using vehicle battery voltage directly.

Another object is to provide a test current circuit having a voltage drop lower than battery voltage.

The invention is carried out by altering the FIG. 1 circuit by substituting a current sink for the current limiting resistor and transistor switch, and removing the boost supply. The current sink is adequate to pass the test current from the current source, yet has a voltage drop of a fraction of a volt. Thus, the voltage of the test current circuit is less than that of FIG. 1 by the amount of the voltage drop across the resistor 28. The net voltage is less than that of the vehicle battery so that a step-up regulator is not necessary.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

The ensuing description of the invention recites specific values which are not critical. That is, the test current may be somewhat smaller than that suggested, so that in that case the current source and the current sink are both adjusted accordingly.

Figure 1:
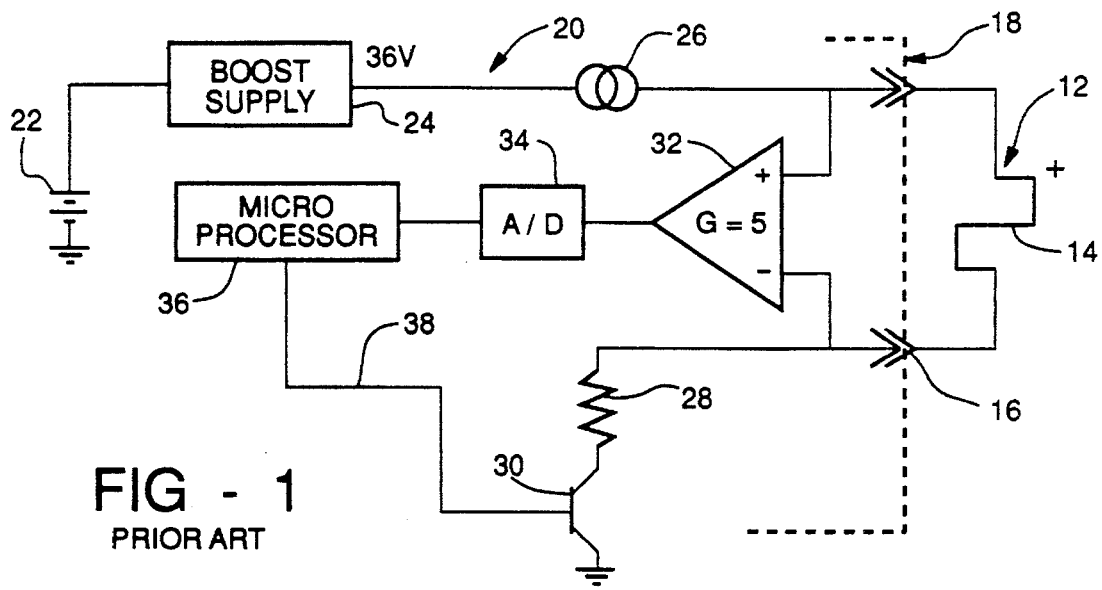
FIG. 1 is a schematic diagram of a deployment path resistance measurement circuit according to the prior art.
Figure 2:
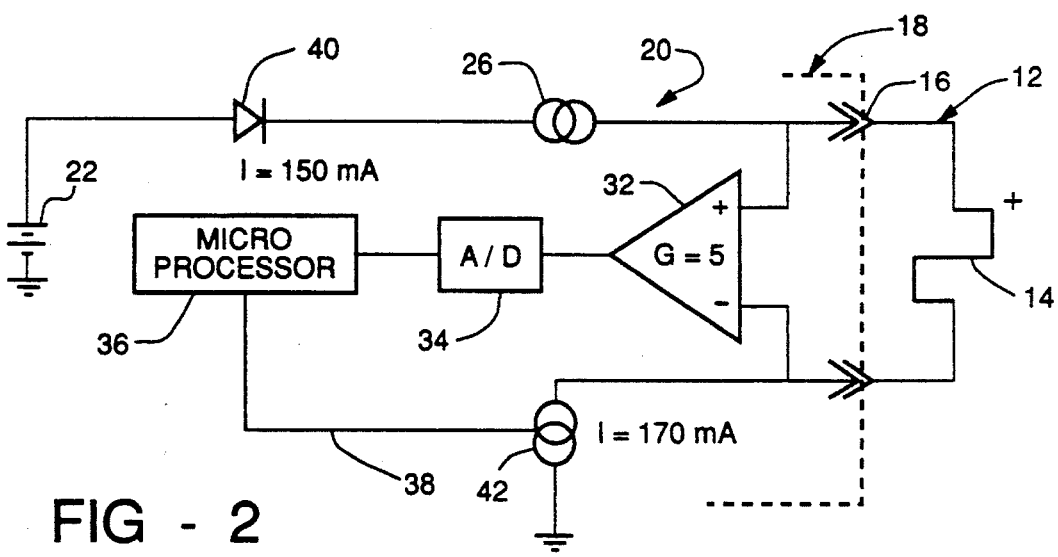
FIG. 2 is a schematic diagram of a deployment path resistance measurement circuit according to the invention.

The FIG. 2 circuit is based on the FIG. 1 design with a few important changes, mainly that the current limiting device is a current sink rather than a resistor, and there is no boost supply.

Referring to FIG. 2, the test current path between the battery 22 and ground comprise a diode 40, the constant current source 26, the external path 12, and a current sink 42, respectively connected in series. The diode 40 provides reverse voltage protection in case the vehicle battery is connected with the wrong polarity. The current sink 42 is connected to line 38 for on/off control by the microprocessor. The voltage checking circuit comprising amplifier 32, A/D converter 34, and microprocessor 36 is the same as in the FIG. 1 circuit. The constant current source 26 is also unchanged.

The current sink 42 is designed to pass a slightly larger current than the rating of the current source 26. Then the voltage drop across the current sink will be small, 0.5 v or less. The voltage drops on the other elements are approximately 0.7 v for diode 40, 2 v or more for the current source 26, and 0.75 v for squib 14. Thus, the total voltage drop of the current test path is less than about 5 v, well below the vehicle battery voltage range.

The voltage drop of the current limiting device is of the same order of magnitude as the voltage across the squib or the external path. In the event that battery voltage is inadvertently applied to the external circuit 12, the current will be limited to the saturation current of the current sink, and the excess voltage will appear across the current sink. About 1.8 A is required to fire the squib; limiting the current through the external path 12 to about 10% of the firing current to provide the proper margin of safety.

Figure 3:
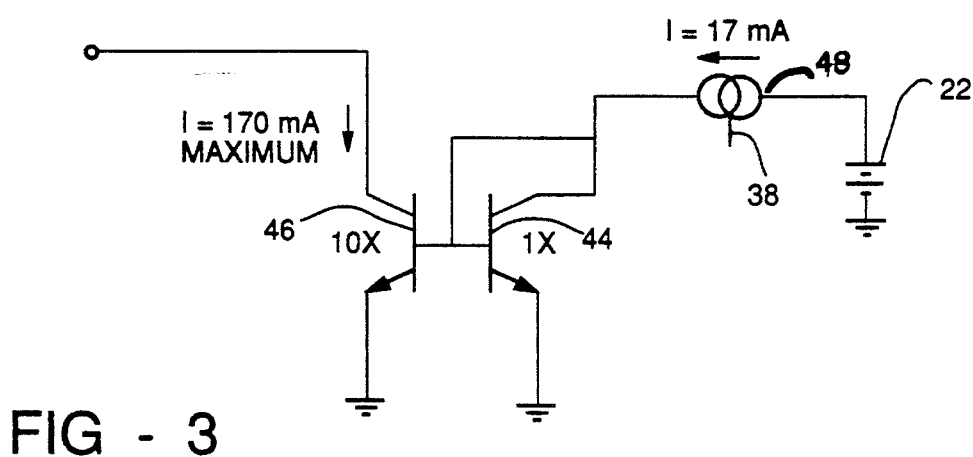
FIG. 3 is a schematic diagram of a current sink circuit used in the circuit of FIG. 2.

The current sink 42 should have a capacity of 20 to 25 mA greater than the test current from the current source 26. A number of current sinks are known in the art and are appropriate for use in this application. For example, a current sink commonly used in integrated circuits is depicted in FIG. 3. A "1X" transistor 44 and a "10X" transistor 46 have bases tied together and to the collector of transistor 44, and both emitters are grounded. The collector of transistor 46 is coupled to the test circuit to receive the test current. Transistor 46 has a base area 10 times that of transistor 44 so that its current will be 10 times greater than transistor 44. A constant current source 48 rated at 17 mA is supplied by the battery 22 and is controlled to turn on and off by the line 38 from the microprocessor. The 17 mA current is applied to transistor 44 so that the transistor 46 can conduct 170 mA at saturation.

It will thus be seen that the circuit according to the invention affords a test current for SIR external path diagnostics as well as over-voltage protection, while reducing the voltage requirement for the test circuit. The cost of the unit is reduced by eliminating a boost supply.

The embodiments of the invention in which an exclusive property or privilege is claimed are defined as follows:

1. In a supplemental inflatable restraint system, an electronic diagnostic circuit, supplied with voltage from a vehicle battery and monitoring an external deployment path containing a squib, comprising:

a constant current source connected between the battery and one end of the external path for supplying a predetermined current to said external deployment path;

a constant current sink connected between the other end of the external path and ground, the current sink being capable of passing a current greater than the predetermined current but substantially less than that capable of firing the squib; and, a voltage sensing and monitoring circuit, connected across said external deployment path, for measuring a voltage across said external deployment path, and thereby determining a resistance of said external deployment path, whereby said voltage sensing and monitoring circuit determines an operating condition of said squib.

2. The invention as defined in claim 1, wherein a diode is coupled between the constant current source and the vehicle battery for affording reverse voltage protection.

3. The invention as defined in claim 1, wherein the constant current sink has a voltage drop less than about one half volt.

\* \* \* \* \*